United States Patent [19]

Takano et al.

[11] Patent Number: 4,607,215

[45] Date of Patent: Aug. 19, 1986

[54] SPECTRUM ANALYZER

[75] Inventors: Mitsuyoshi Takano, Tokyo; Mamoru Ando, Hiratsuka, both of Japan

[73] Assignee: Anritsu Electric Co., Ltd., Tokyo, Japan

[21] Appl. No.: 582,938

[22] Filed: Feb. 23, 1984

[30] Foreign Application Priority Data

Feb. 27, 1983 [JP] Japan ................... 58-31155

[51] Int. Cl.$^4$ ..................... G01R 23/16; H04B 1/26
[52] U.S. Cl. .................. 324/77 B; 455/197; 455/249; 455/169; 455/226; 455/186
[58] Field of Search .............. 324/77 B, 79 R, 79 D; 364/485, 484; 455/185, 169, 249, 226, 185, 186, 226, 197

[56] References Cited

U.S. PATENT DOCUMENTS 3,641,545 2/1972 Sues ...................... 364/485

Primary Examiner—Reinhard J. Eisenzopf
Assistant Examiner—G. Peterkin
Attorney, Agent, or Firm—Frishauf, Holtz, Goodman & Woodward

[57] ABSTRACT

A spectrum analyzer having an automatic attenuator setting function, actuatable to automatically set the degree of attenuation provided by an input attenuator to an optimum value in accordance with the peak level of the frequency span of a signal under measurement, i.e. to a minimum attenuation value consistent with the prevention of generation of spurious signal components through distortion within the spectrum analyzer, e.g. harmonic frequency distortion within the mixer of the spectrum analyzer. Low-level frequency components can thereby be observed without the presence of spurious components on the spectrum analyzer display, with no need for manual input attenuator adjustment. A compensating degree of I.F. amplification is automatically provided to match the attenuation setting.

2 Claims, 6 Drawing Figures

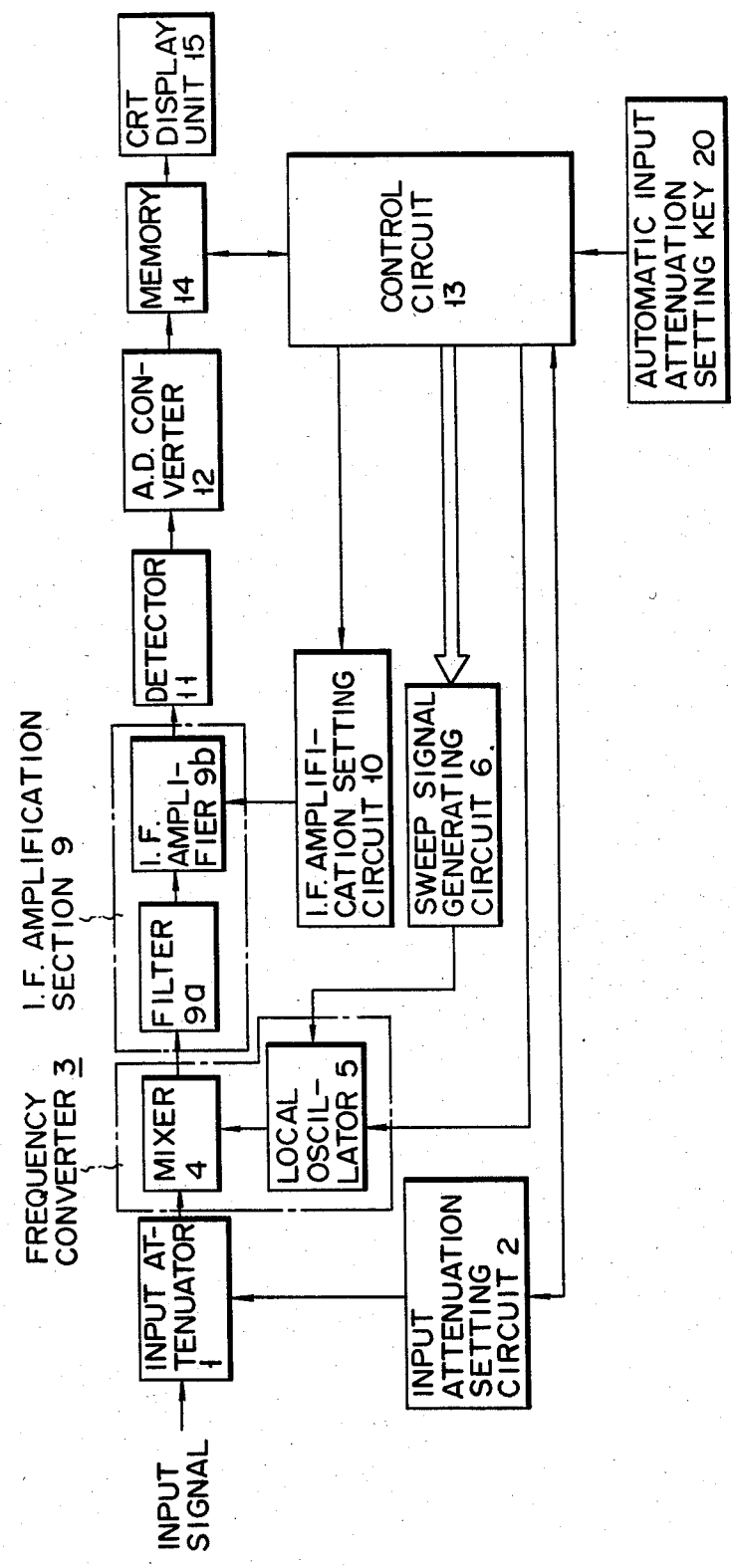
F I G. 2

F I G. 3A
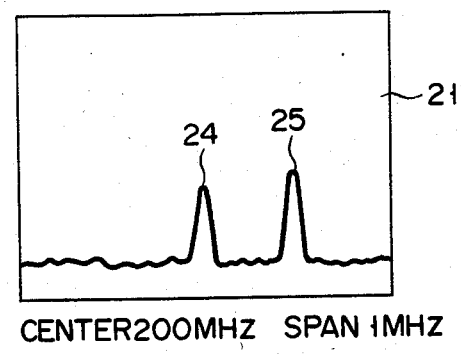
F I G. 3B
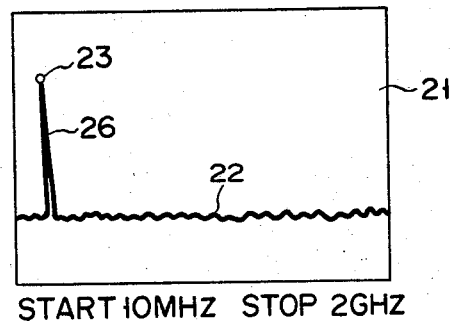
F I G. 3C
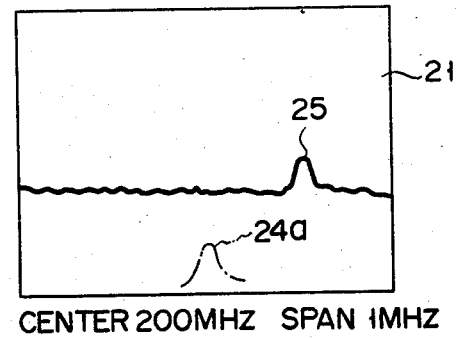

SPECTRUM ANALYZER

BACKGROUND OF THE INVENTION

The present invention relates to a spectrum analyzer provided with a function whereby the degree of attenuation provided by the input attenuator of the spectrum analyzer can be automatically set to an optimum value with regard to the prevention of generation of spurious signal components within the spectrum analyzer due to distortion, i.e. primarily due to harmonic distortion resulting from nonlinearity of the mixer frequency conversion characteristic when a large-amplitude signal is applied.

The mixer of the frequency converter circuit in a spectrum analyzer, which converts a range of frequency components of an input signal to an intermediate frequency in response to a sweep frequency signal applied from a local oscillator, does not have an ideally linear frequency conversion characteristic. This fact will not normally present a problem when relatively large-amplitude components of the frequency spectrum of an input signal under measurement are being examined on the spectrum analyzer display screen. However when examining low-level components of the spectrum, i.e. low-amplitude peaks on the displayed spectrum, difficulties can arise. That is, if the spectrum contains one or more high-level frequency components, then these can produce harmonic distortion or other types of distortion within the spectrum analyzer circuits, and particularly within the mixer. Such distortion results in the appearance of spurious signal components on the display, which have a similar form to actual input signal frequency component peaks, and may be of comparable or larger amplitude on the display. In the prior art, it has been necessary for the operator of the spectrum analyzer to eliminate such spurious components by manually reducing the amplitude of the input signal applied to the mixer, i.e. by operating a knob controlling an input attenuator disposed between the input signal source and the mixer input. However it is necessary for the operator to be sufficiently knowledgable and experienced to be capable of distinguishing between actual input signal components and spurious components on the display, and this requires many years to acquire.

In order to overcome this problem, it has been proposed to provide a power-level sensor in the input circuit of an spectrum analyzer, and to control the setting of the input attenuator automatically in accordance with the output obtained from this sensor. However, although this method is satisfactory for measuring signals of relatively low frequency, it cannot be employed for measuring high-frequency signals, e.g. of the order of 2 GHz, due to the difficulty of implementing a suitable input circuit and power sensor.

There is therefore a requirement for a spectrum analyzer provided with a function whereby the degree of attenuation provided by an input attenuator can be automatically set to an optimum value, so that the generation of spurious signal components within the spectrum analyzer due to large-amplitude frequency components in the input signal will be prevented, when examining low-amplitude frequency components of the input signal, with no manual adjustment or judgement of the displayed spectrum being required of the operator.

With a prior art spectrum analyzer, a switch is provided whose setting determines the amplitude of an input signal frequency component represented by a specific scale graduation of the display screen. That is to say, if this switch is set such a particular reference graduation, (e.g. the highest scale graduation of the "amplitude" scale of the spectrum analyzer display device) represents +25 dBm, then an input signal frequency component peak of +25 dBm will be displayed on the screen to extend upwards as far as that highest graduation. Such a signal level will be referred to in the following as the "reference level". It will be apparent that the reference level is determined by the overall circuit gain, from the point at which an input signal is applied to the spectrum analyzer to the point at which the intermediate frequency signal is detected, to derive an analog signal representing a frequency spectrum. Thus, the reference level can be altered by varying the degree of attenuation provided by an attenuator disposed between the input signal source and the mixer stage of the spectrum analyzer, or by varying the intermediate frequency amplifier circuit gain. However, in general, the reference level is varied by switching the input attenuator, with the resultant change in reference level being indicated either by the change in switch knob position or by an indication provided on the display screen or elsewhere on the spectrum analyzer. With a prior art spectrum analyzer, therefore, in order to examine a low-level frequency component of an input signal spectrum, the operator will lower the reference level, i.e. will operate this switch such as to reduce the degree of attenuation provided by the input attenuator. However as described above, this will result in spurious signal components being generated, if large-amplitude frequency components are also present in the input signal.

SUMMARY OF THE INVENTION

With a spectrum analyzer according to the present invention, when an automatic attenuator setting function is initiated, then the current values of frequency span, center frequency, and reference level are first memorized. A frequency sweep of the input signal over a predetermined wide frequency span is then performed, with the reference level set to the highest value thereof. The data resulting from this sweep, i.e. the analog signal representing the frequency spectrum within that frequency span is converted into digital data values, which are stored in a memory circuit in accordance with their relative frequencies. These digital data values are then read out of the memory, and processing is performed on these to detect the highest-amplitude frequency component of the input signal. Based on the level of this highest-amplitude component, the degree of attenuation provided by the input attenuator is then adjusted to the optimum value, i.e. the minimum attenuation value which will be sufficient to ensure that no appreciable spurious signal components will be generated within the spectrum analyzer as a result of the highest-amplitude frequency component of the input signal being measured. The degree of amplification provided by the intermediate frequency amplifier circuit is then adjusted such as to restore the value of reference level which was set prior to initiation of the automatic attenuator setting function (i.e. such as to make the overall gain from input to the input attenuator to output from the intermediate frequency amplifier circuit equal to its previous value). A frequency sweep is then performed using the memorized values of frequency span and center frequency.

In this way, an optimum degree of input attenuator setting is automatically established, with regard to the highest-amplitude frequency component present in the input signal frequency spectrum, with no adjustment skill or special knowledge being required from the operator.

BRIEF DESCRIPTION OF THE DRAWINGS

FIG. 2 is a general block circuit diagram of an embodiment of a spectrum analyzer according to the present invention;

FIGS. 3A to 3C are diagrams illustrating the spectrum analyzer display produced by the automatic attenuation setting function of an spectrum analyzer according to the present invention.

DETAILED DESCRIPTION OF THE PREFERRED EMBODIMENTS

Figure 1:
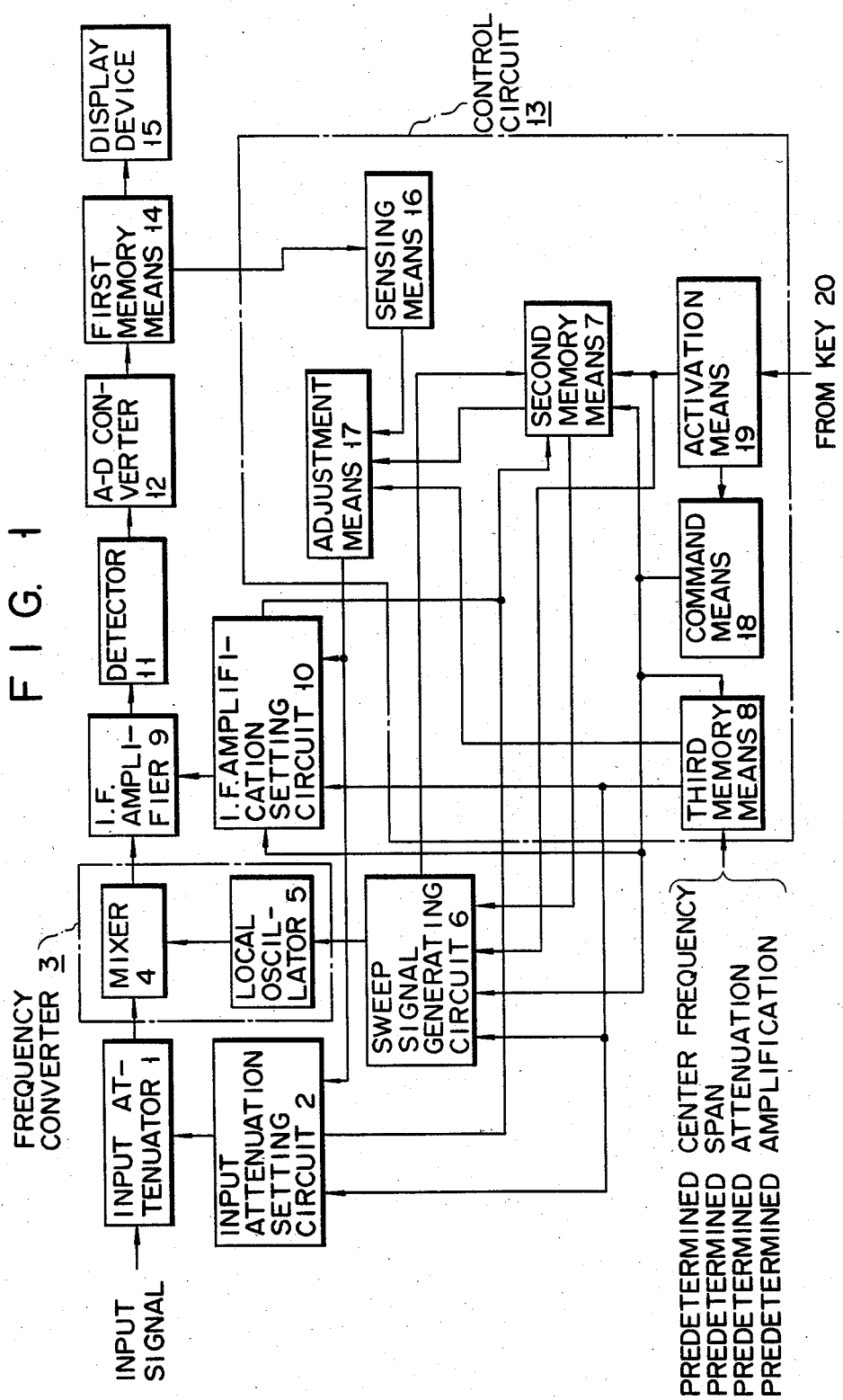
FIG. 1 is a block circuit diagram illustrating the general configuration of a spectrum analyzer according to the present invention.

In the block diagram of FIG. 1, there is shown an input attenuator 1, coupled to receive an input signal being measured, and a frequency converter circuit 3 for converting the input signal to an intermediate frequency signal, comprising a mixer 4 and local oscillator 5. It should be noted that the term "local oscillator" as used herein simply denotes circuit means which are controllable by external signals to generate a signal of continuously varying frequency, such as a voltage-controlled oscillator circuit, frequency synthesizer circuit, etc. The intermediate frequency signal from mixer 4 is amplified by an intermediate frequency amplifier circuit 9, and the output signal therefrom is envelope-detected by a detector circuit 11, i.e. detector 11 produces an analog output signal representing the frequency spectrum of the input signal being measured within a specific frequency span. This signal is converted into a succession of digital data values by an analog-digital converter circuit 12, which values are stored in first memory means 14, in addresses therein in accordance with the frequencies corresponding to the digital data values. The memory contents are read out and displayed by a display device 15 such as a CRT display, these storage and readout operations being carried out under the control of a control circuit 13.

An input attenuation setting circuit 2 produces signals under the control of control circuit 13, which are applied to input attenuator 1, to determine the degree of attenuation provided thereby. Similarly, an I.F. amplification setting circuit 10 produces signals under the control of control circuit 13, which are applied to intermediate frequency amplifier circuit 9 to determine the amount of amplification provided thereby. Voltage ramp signals produced by sweep signal generating circuit 6 under the control of control circuit 13 control the sweep frequency signals produced by local oscillator 5, i.e. determine the center frequency and the frequency span of each sweep.

In control circuit 13, second memory means 7 serves to store the current center frequency, frequency span and reference level at which the spectrum analyzer is operating. These values are utilized after an automatic attenuation operation has been completed, as described hereinafter. Third memory means 8 serves to store a predetermined center frequency, a predetermined frequency span, a predetermined input attenuation (i.e. a predetermined input attenuator setting), and predetermined I.F. amplification (i.e. a predetermined level of intermediate frequency amplifier circuit gain). Control circuit 13 further comprises sensing means 16, activation means 19, command means 18 and adjustment means 17, whose functions will be described in the following.

Figure 4:
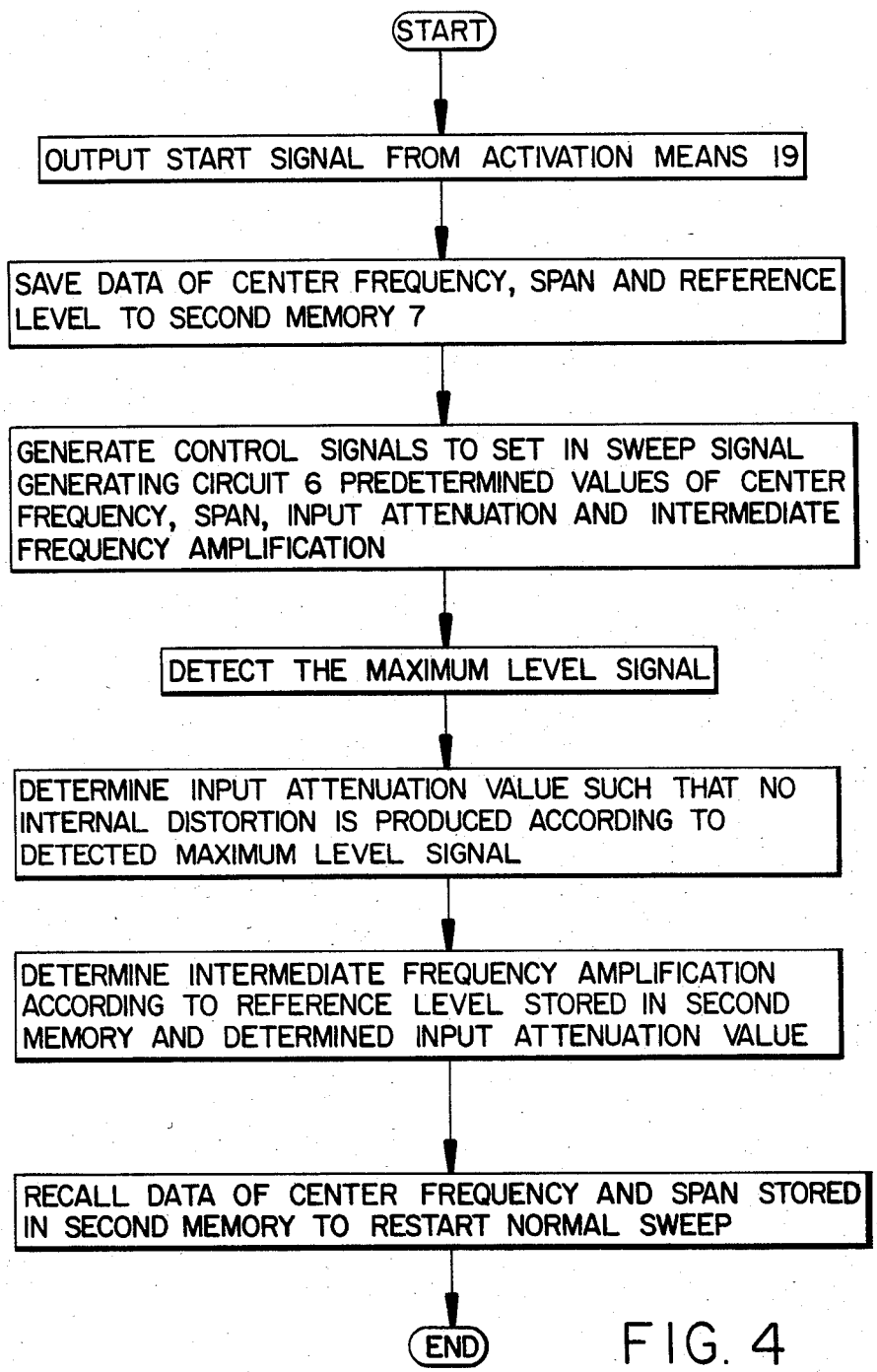
FIG. 4 is a flow chart for explaining the operation of a control circuit.

The operation of this spectrum analyzer is as follows referring to FIG. 4. Firstly, in order to initiate an automatic input attenuation setting operation, a key 20 (shown in FIG. 2) is actuated to drive activation means 19. In response, command means 18 is driven by an output of the activation means 19 and generates control signals to cause the values of center frequency, frequency span and reference level which are currently utilized to be stored in second memory means 7. Command means 18 then generates control signals whereby the predetermined center frequency and predetermined frequency span values stored in third memory means 8 are input to sweep signal generating circuit 6. In response, sweep signal generating circuit 6 generates signals (when subsequently activated by a signal from activation means 19) whereby a frequency sweep over a wide frequency range (referred to in the following as a peak detection frequency sweep) is performed by frequency converter 3 which is centered on the predetermined center frequency and covers the predetermined frequency span. In addition, command means 18 cause the predetermined input attenuation value and the predetermined I.F. amplification value held in third memory means 8 to be respectively input to input attenuation setting circuit 2 and to I.F. amplification setting circuit 10, which in turn produce control signals to set the degree of attenuation provided by input attenuator 1 and the degree of amplification provided by intermediate frequency amplifier circuit 9 to be equal to the predetermined values from third memory means 8. These values of attenuation and amplification will in general be selected such as to establish the maximum reference level for the spectrum analyzer, i.e. to provide maximum attenuation and minimum amplification respectively.

During the peak detection frequency sweep, the resulting detection signal which is output from detector 11 is sequentially converted into digital data values by analog-digital converter circuit 12, which are stored in addresses of first memory means 14 in addresses which are in accordance with the frequencies corresponding to the digital data values. To establish this correspondence, the A-D conversion is controlled by a clock signal (not shown in the drawings) which is suitably synchronized with frequency conversion operation of frequency converter 3. Upon completion of the peak detection frequency sweep, the contents of first memory means 14 are successively read out under the control of control circuit 13 and applied to display device 15 (after appropriate signal processing) to be displayed as a frequency spectrum. At the same time, the digital data values are processed by sensing means 16 which act to determine the maximum amplitude of the input signal under measurement. Data in accordance with the value of this maximum signal level is then transferred from sensing means 16 to adjustment means 17, which converts this value into suitable data values for input to input attenuation setting circuit 2 and I.F. amplification setting circuit 10 such as to establish an optimum value of input attenuation. More specifically, the data value which is set into input attenuation setting circuit 2 designates control of the degree of attenuation provided by input attenuator 1 such that the input signal level applied to mixer 4 will be sufficiently low that no spurious signal components will be produced as a result of harmonic distortion, etc. The data value which is set into I.F. amplification setting circuit 10, on the other hand, designates control of the degree of amplification provided by intermediate frequency amplifier circuit 9 such as to establish (in conjunction with the newly established value of input attenuation) the reference level value which is stored in second memory means 7, i.e. the reference level which was being utilized prior to initiation of the automatic attenuation setting operation. That is to say, the new value of intermediate frequency amplifier circuit gain is set such that, with the newly established value of input attenuation, the overall circuit gain level from the point of input to attenuator 1 to output from intermediate frequency amplifier circuit 9 will be identical to that prior to initiation of the automatic attenuation setting operation.

A frequency sweep is now initiated, under the control of control circuit 13, using these values of frequency span, center frequency, input attenuation and intermediate frequency amplifier circuit gain. The resultant detection signal from detector 12 is again converted into digital data values by analog-digital converter circuit 12, which are stored in accordance with their relative frequencies in addresses of first memory means 14, and upon completion of this sweep the digital data values are successively read out from first memory means 14 to be displayed as a frequency spectrum with the desired frequency span, center frequency and reference level, upon display device 15. The displayed spectrum will be free from the presence of spurious signal components, due to the degree of input attenuation established automatically as described above.

The span of the peak detection frequency sweep, whose value is present in the third memory means as described above, can be fixed or can be made presettable by the operator. This span should be wide, but with the lowest frequency of the span being selected such as to eliminate the zero-beat component. The predetermined input attenuation and predetermined I.F. amplification values should in general be such as to correspond to the maximum reference level of the spectrum analyzer, i.e. maximum attenuation and minimum gain.

FIG. 2 is a general block diagram of an embodiment of a spectrum analyzer according to the present invention, in which the blocks denoted by numerals 1 to 5, 9 to 12 and 14 correspond to the similarly numbered blocks of FIG. 1. Block 9 is an intermediate frequency amplification section, comprising a band-pass filter 9a and an intermediate frequency amplifier circuit 9b. A CRT display unit comprises display device 15. An automatic input attenuation setting key 20 is actuated to initiate an automatic attenuation setting operation under the control of a control circuit 13, in the manner described hereinabove with reference to FIG. 1. Control circuit 13 comprises a combination of a suitably programmed microprocessor combined with RAM and ROM storage, to perform the functions of command means 18, activation means 19, sensing means 16, adjustment means 17, and second and third memory means 7 and 8 shown in FIG. 1.

FIGS. 3A, 3B and 3C are diagrams illustrating the display provided by CRT display unit 15 of this embodiment, prior to, during and following actuation of automatic input attenuation setting key 20 to initiate an automatic attenuation setting operation. It will be assumed that, prior to this key actuation, it is being attempted to examine a low-amplitude frequency peak in the spectrum of an input signal, using a frequency span of 1 MHz and a center frequency of 200 MHz. As shown in FIG. 3A, two peaks, 24 and 25 actually appear on display screen 21 of CRT display unit 15, and it is necessary for the operator to determine if one of these is a spurious signal resulting from a large-amplitude frequency component in the input signal spectrum, and, if so, which peak corresponds to an actual input signal component. The operator therefore actuates automatic input setting key 20, to initiate an automatic attenuation setting operation. The current values of frequency span, center frequency and reference level are then memorized in control circuit 13, and a wide-span peak detection frequency sweep is then performed and the maximum level of the input signal is computed by control circuit 13 from the digital data values derived from that peak detection frequency sweep, as described previously. The result of this peak detection frequency sweep is displayed on CRT display 15 as shown in FIG. 3B, with a marker 23 being automatically positioned at the peak level 26 of the input signal spectrum 22.

A data value based on the value of this peak level is then set into input attenuation setting circuit 2, which thereby controls the degree of attenuation provided by input attenuator 1 such as to reduce the level of peak component 26 by a sufficient amount, prior to input to mixer 4, so that no appreciable spurious component will be generated as a result of that large-amplitude peak. In addition, a data value is set into I.F. amplification setting circuit 10 which controls the amount of gain provided by intermediate frequency amplifier circuit 9b to be such as to establish the same reference level value as that in use prior to initiation of the automatic attenuation setting operation and which is stored in control circuit 13. A frequency sweep is again performed, using the previous values of frequency span and center frequency, temporarily stored in control circuit 13 prior to the peak detection frequency sweep as described, and the result of this sweep is displayed as shown in FIG. 3C. Since the amount of input attenuation has been increased automatically in order to reduce the effects of large-amplitude peak component 23, and the intermediate frequency gain has been increased to compensate for this increased attenuation, the noise level of the output signal from intermediate frequency amplifier circuit 9b has increased significantly by comparison with the case of FIG. 3A, as shown. However, due to the increased amount of input attenuation, the amplitude of the peak resulting from spurious signal generation by peak component 26 has been greatly reduced, and this is now below the noise level as indicated by numeral 24a in FIG. 3C. Since peak 25 has remained at the same level on display 21 as that prior to initiation of the automatic attenuation setting operation, it will be apparent to the operator that peak 25 represents an actual component of the spectrum of the input signal being measured.

It will therefore be apparent from the above description that a spectrum analyzer according to the present invention enables examination of even low-level components of an input signal frequency spectrum to be effectively examined and measured by inexperienced and unskilled personnel, and eliminates the inconvenience presented by prior art types of spectrum analyzers with respect to manual operations to eliminate the effects of spurious signal components generated within the spectrum analyzer itself.

Although the present invention has been described in the above with reference to specific embodiments, it should be noted that various changes and modifications to the embodiments may be envisaged, which fall within the scope claimed for the invention as set out in the appended claims. The above specification should therefore be interpreted in a descriptive and not in a limiting sense.

What is claimed is:

1. A spectrum analyzer, comprising:
   input attenuator means coupled to receive an input signal;
   input attenuation setting circuit means for controlling in accordance with a data value held therein the degree of attenuation provided by said input attenuator means;
   frequency converter circuit means comprising a local oscillator and a mixer, said mixer being coupled to receive an output signal from said local oscillator circuit and said input signal after attenuation thereof by said attenuator means, for converting said input signal to an intermediate frequency signal;
   sweep signal generating means coupled to said local oscillator circuit to control the frequency thereof;
   intermediate frequency amplifier means coupled to receive said intermediate frequency signal from said mixer;
   intermediate frequency amplification setting means for controlling in accordance with a data value held therein the degree of amplification provided by said intermediate frequency amplifier means;
   detector circuit means coupled to receive said intermediate frequency signal from said intermediate frequency amplifier means, for producing a detection signal representing the amplitude of said intermediate frequency signal;
   analog-digital converter circuit means for converting said detection signal to digital data values;
   first memory circuit means for storing said digital data values from said analog-digital converter circuit means;
   display means for displaying the contents of said first memory circuit means; and
   control circuit means for storing values representing a predetermined frequency span, predetermined center frequency, a predetermined input attenuation, and a predetermined intermediate frequency amplification value, and operable to first generate control signals for storing the current values of frequency span, the center frequency thereof, and a current reference level which is determined by the current values of input attenuation and intermediate frequency amplification, then to set said predetermined value of input attenuation into said input attenuation setting circuit and to set said predetermined value of intermediate frequency amplification into said intermediate frequency amplification setting circuit, and to set said predetermined values of frequency span and center frequency into said sweep signal generating circuit, then to initiate a peak detection frequency sweep by activating said sweep signal generating means to generate a sweep signal whereby said local oscillator circuit output signal is first swept over a frequency range corresponding to said predetermined frequency span which is centered on said predetermined center frequency and whereby said input attenuator means apply said predetermined value of attenuation to said input signal and said intermediate frequency amplifier performs amplification of said intermediate frequency signal in accordance with said predetermined amplification value, with said intermediate frequency signal generated during said peak detection frequency sweep being converted into digital data values and successively stored in addresses of said first memory circuit means, said control circuit means further acting to determine from said digital data values of said peak detection frequency sweep the peak level of the frequency spectrum of said input signal and to compute therefrom in conjunction with said memorized reference level and to set into said input attenuation setting means and said intermediate frequency amplification setting means respectively a value of input attenuation which is optimized with regard to generation of spurious signal components within said frequency analyzer and a corresponding value of intermediate frequency amplification such as to re-establish said stored reference level, and to set said memorized values of frequency span and center frequency into said sweep signal generating circuit means and thereafter activate said sweep signal generating circuit means to initiate a frequency sweep utilizing said frequency span and center frequency values.

2. A spectrum analyzer according to claim 1, in which said control circuit means comprises:
   second memory circuit means for storing said current values of frequency span, center frequency and reference level;
   third memory circuit means for storing predetermined center frequency, predetermined frequency span, predetermined input attenuation and predetermined intermediate frequency amplification values;
   sensing means for detecting the amplitude of said input signal peak level from said digital data values; and
   command and activation circuit means for generating control signals and activation signals including signals to initiate said peak detection frequency sweep.

* * * * *